(12) United States Patent
Mann et al.

(10) Patent No.: US 8,203,398 B2
(45) Date of Patent: Jun. 19, 2012

(54) MEASURING POWER

(75) Inventors: Ekkehard Mann, Gundelfingen (DE); Christoph Gerhardt, Freiburg (DE); Christian Thome, Freiburg (DE); Christian Wangler, March (DE); Daniel Krausse, Freiburg (DE); Stephan Guenther, Muenstertal (DE); Rolf Weber, Munich (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 69 days.

(21) Appl. No.: 12/537,557

(22) Filed: Aug. 7, 2009

(65) Prior Publication Data
US 2010/0026415 A1    Feb. 4, 2010

Related U.S. Application Data

(63) Continuation of application No. PCT/EP2008/000944, filed on Feb. 7, 2008.

(30) Foreign Application Priority Data

Feb. 8, 2007    (DE) .......................... 10 2007 006 225

(51) Int. Cl.
*H01P 5/18*    (2006.01)
*H01P 3/08*    (2006.01)

(52) U.S. Cl. ........................................ 333/111; 333/116

(58) Field of Classification Search .................. 333/109, 333/110, 111, 112, 115, 116, 124, 131
See application file for complete search history.

(56) References Cited

U.S. PATENT DOCUMENTS

| 3,581,243 | A | * | 5/1971 | Alford | 333/116 |
| 4,376,921 | A | * | 3/1983 | Dickens et al. | 333/116 |
| 4,644,260 | A |   | 2/1987 | Warder |  |
| 5,235,295 | A | * | 8/1993 | Barbaste et al. | 333/28 R |
| 5,424,694 | A |   | 6/1995 | Maloratsky et al. |  |
| 5,557,245 | A | * | 9/1996 | Taketa et al. | 333/116 |
| 6,311,638 | B1 |  | 11/2001 | Ishii et al. |  |
| 2002/0113601 | A1 | * | 8/2002 | Swank, II | 324/637 |
| 2002/0113667 | A1 |  | 8/2002 | Tahara et al. |  |

(Continued)

FOREIGN PATENT DOCUMENTS

DE    3318520    4/1984

(Continued)

OTHER PUBLICATIONS

Almgren, Carl, "RF Measurements and their role in the manufacturing environment", Advanced Energy Industries, Inc., 2000, pp. 1-4.

(Continued)

*Primary Examiner* — Dean O Takaoka
(74) *Attorney, Agent, or Firm* — Fish & Richardson P.C.

(57) ABSTRACT

One aspect of the invention includes a directional coupler having a coupling factor in the forward direction determined from the equation $C_f = C_f \cdot e^{j\Phi_{Cf}}$, a coupling factor in the reverse direction determined from the equation $C_r = C_r \cdot e^{j\Phi_{Cr}}$, an isolation in the forward direction determined from the equation $I_f = I_f \cdot e^{j\Phi_{If}}$, and an isolation in the reverse direction determined from the equation $I_r = I_r \cdot e^{j\Phi_{Ir}}$, wherein at least one condition is met from among the group consisting of: (1) the absolute value of $\Delta\phi = \phi_{Cr} + \phi_{Cf} - (\phi_{Ir} + \phi_{If})$ being less than or equal to 20°, $$K = \frac{C_f}{C_r} * \frac{I_r}{I_f} \qquad (2)$$

is less than or equal to 1.6, and (3) Cf=Cr and If=Ir.

18 Claims, 3 Drawing Sheets

U.S. PATENT DOCUMENTS

2005/0017822 A1  1/2005  Runyon
2005/0212617 A1  9/2005  Chen

FOREIGN PATENT DOCUMENTS

| DE | 10121535 | 11/2002 |
| DE | 102004021535 | 7/2005 |
| EP | 1739716 | 1/2007 |
| JP | 2005341279 | 12/2005 |
| WO | WO8808211 | 10/1988 |

OTHER PUBLICATIONS

Emery et al., "Analysis and design of ideal non symmetrical coupled microstrip directional couplers", IEEE MTT-S Digest, 1989, pp. 329-332.

Heckman et al., "The Evolution of RF Power Delivery in Plasma Processing", Advanced Energy Industries, Inc., 2001, pp. 1-8.

Pozar, David M., "Microwave Engineering", US, Reading, Addison Wesley, 1990, pp. 383-391.

Scholl, Richard A., "Forward and Reflected Powers—what do they mean?", Advanced Energy Industries, Inc., 2001, pp. 1-4.

International Search Report from corresponding PCT Application No. PCT/EP2008/000944, mailed May 30, 2008, 13 pages.

Search Report from German Application No. DE 10 2008 005 204. 3-55, mailed Nov. 11, 2008, 3 pages.

Search Report from corresponding German Application No. DE 10 2007 006 225.9, mailed Oct. 26, 2007, 4 pages.

International Preliminary Report on Patentability from corresponding International Application No. PCT/EP2008/000944, mailed Aug. 11, 2009, with a copy of the English translation which was mailed Sep. 8, 2009, 15 total pages.

\* cited by examiner

MEASURING POWER

CROSS REFERENCE TO RELATED APPLICATION

This application is a continuation of PCT International Application No. PCT/EP2008/000944, filed Feb. 7, 2008, which claims priority to German Patent Application No. DE 10 2007 006 225.9, filed on Feb. 8, 2007. The entire contents of the PCT application are hereby incorporated by reference.

TECHNICAL FIELD

The invention relates to measuring forward and reverse or reflected power using a directional coupler having a phase error value $|\Delta\phi| \leq 20°$.

BACKGROUND

High frequency ("HF") generators are used to generate HF power and to deliver it to a load including, for example, plasma processes, such as plasma coating and plasma etching. Since the impedance of the load may change, and as a consequence, in the event of mismatching, (partial) reflection of the power delivered by the HF generator may occur, the total power supplied by the HF generator is often not absorbed in the load (the plasma). In order to be able to adjust accurately or regulate the HF power delivered to the load, it is desirable to determine the power absorbed in the load.

A directional coupler can be used to measure/determine the HF power absorbed in a load based on the difference between the power generated by the HF generator and the reflected power. It is therefore possible to control the HF generator in such a way that the power absorbed in the load is very accurately adjusted and can be maintained at a constant level.

The measurement by a directional coupler or by a reflectometer of the power delivered to a load (incident power, forward power), and the measurement of the reflected power is nevertheless prone to error due to the finite directivity of the directional coupler. The measurement of the power absorbed in the load is therefore likewise prone to error. A phase measurement between the incident and the returning wave (power delivered to the load and the power reflected by the load) can be used to compensate for this error.

Another possible method of accurately measuring the power delivered into the load is to measure the current and the voltage. However, in this case, a very good decoupling of the voltage sensor and the current sensor must be achieved. In addition, a very accurate phase measurement between the voltage and the current is required.

FIG. 1a shows a high frequency system 11 having a high frequency generator 100 as source, a coupler arrangement 12 with a coupler 200 in the form of a directional coupler, plus a load 300 as drain. The coupler has a main line 290 having a first and second port 1, 3 and a coupling line 291 with coupling line ports 2, 4, which are terminated by impedances 205, 206, which correspond to the nominal impedance $Z_0$ of the high frequency system 11 or at least to that of the coupler 200. At the port 2, a proportion of the incident wave at the corresponding port 1 of the main line 290 can be observed with a measuring device 207; correspondingly, at the port 4 a proportion of the wave reflected by the load and incident at the corresponding port 3 of the main line can be observed with a measuring device 208. The magnitude of the proportion depends in each case on the coupling factor. In an ideal coupler, the directivity is infinitely large, and at the port 2 no proportion of the wave incident at port 3 will be observed and at port 4 no proportion of the wave incident at port 1 will be observed.

FIG. 1b likewise shows a high frequency system 10. The coupler 240 comprises coupling lines 291, 292. At the port 2 of the first coupling line 291, a proportion of the wave fed in at the port 1 of the main line 290 is measured, at port 4 of the second coupling line 292 a proportion of the wave fed in at port 3 of the main line 290 is measured. The ports 223, 4 of the second coupling line 292 are terminated by the impedances 225, 226, which correspond to the nominal impedance $Z_0$.

To describe n-port networks, such as a directional coupler for example, it is customary to consider wave amplitudes or wave strengths at the ports instead of the voltage sources. In this connection, the wave strength of an incident wave at port i is normally denoted by the letter $a_i$ and the wave strength of the outbound wave at port i is denoted by the letter $b_i$. Furthermore, the outbound and incident waves are typically linked by way of a scattering matrix.

A directional coupler can be regarded as a four-port network, the transmission characteristic of which can be described by the complex variables of coupling factor and isolation. In FIG. 1b, the directional coupler 10 is illustrated as a four-port network with coupling lines 291, 292 that are arranged on both sides of the main line 290. Here, $C_f = C_f \cdot e^{j\Phi_{Cf}}$ is the coupling factor in the forward direction, i.e. from port 1 to port 2. The coupling factor in the reverse direction is $C_r = C_r \cdot e^{j\Phi_{Cr}}$, i.e. from port 3 to port 4. Correspondingly, $I_f = I_f \cdot e^{j\Phi_{If}}$ is the isolation in the forward direction (port 1 to port 4) and $I_r = I_r \cdot e^{j\Phi_{Ir}}$ is the isolation in the reverse direction (port 3 to port 2). The variables $C_f, C_r, I_f, I_r$ are in the present case the reciprocal values of the scattering parameters of the scattering matrix. Provided that $1 \ll \lambda$:

$$\underline{a_3} \approx \underline{b_1}$$

$$\underline{b_1} = \underline{\Gamma} \cdot \underline{a_1}$$

$$\underline{b_4} = \underline{a_1} \cdot \frac{1}{\underline{I_f}} + \underline{a_3} \cdot \frac{1}{\underline{C_r}} \approx \underline{a_1}\left(\frac{1}{\underline{I_f}} + \frac{\underline{\Gamma}}{\underline{C_r}}\right)$$

$\underline{\Gamma}$ being the reflection factor.

SUMMARY

One aspect of the invention includes a directional coupler having a coupling factor in the forward direction determined from the equation $C_f = C_f \cdot e^{j\Phi_{Cf}}$, a coupling factor in the reverse direction determined from the equation $C_r = C_r \cdot e^{j\Phi_{Cr}}$, an isolation in the forward direction determined from the equation $I_f = I_f \cdot e^{j\Phi_{If}}$, and an isolation in the reverse direction determined from the equation $I_r = I_r \cdot e^{j\Phi_{Ir}}$, wherein at least one condition is met from among the group consisting of: (1) the absolute value of $\Delta\phi = \phi_{Cr} + \phi_{Cf} - (\phi_{Ir} + \phi_{If})$ being less than or equal to 20°, $$K = \frac{C_f}{C_r} * \frac{I_r}{I_f} \qquad (2)$$

is less than or equal to 1.6, and (3) Cf=Cr and If=Ir.

Some examples may include additional features such as, (1) wherein $\phi_{Cr} = -\phi_{Cf} + k$ and $\phi_{Ir} = -\phi_{If} + k$, and/or (2) wherein $I_f, I_r$, or both, $I_f$ and $I_r$, are greater than $C_f, C_r$, or both $C_f$ and $C_r$. In some instances, the directional coupler may also include the additional features of (1) two coupling lines, which at least in sections are arranged parallel to one another, (2) a coupling line terminated with an impedance arrangement having a variable impedance, and/or (3) a main line, and a coupling variance, wherein the coupling variance is arranged between the coupling line and the main line. Further, in some cases, the coupling variance is a variable resistance. In some examples, the position of the coupling variance between the coupling line and the main line is alterable. Still further, in some instances, an impedance value of the impedance arrangement can be altered by an electronic control signal and/or the impedance arrangement is driven by an electronic circuit. In some examples, the electronic circuit is in the form of a closed loop circuit. In some implementations, the impedance arrangement comprises at least two variable impedances, which are not collinear in the complex resistance plane.

Another aspect includes adjusting a directional coupler having a coupling factor in the forward direction $C_f = C_f \cdot e^{j\phi_{Cf}}$, a coupling factor in the reverse direction $C_r = C_r \cdot e^{j\phi_{Cr}}$, an isolation in the forward direction $I_f = I_f \cdot e^{j\phi_{If}}$, and an isolation in the reverse direction $I_r = I_r \cdot e^{j\phi_{Ir}}$, wherein responsive to the adjusting of the directional coupler, at least one condition is met from among the group consisting of (1) $\Delta\phi = \phi_{Cr} + \phi_{Cf} - (\phi_{Ir} + \phi_{If})$ being less than or equal to 20°, $$K = \frac{C_f}{C_r} * \frac{I_r}{I_f} \quad (2)$$

being less than or equal to 1.6, and (3) $I_f$, $I_r$, or, both, $I_f$ and $I_r$ are greater than $C_f$, $C_r$, or, both, $C_f$ and $C_r$. In some examples, adjusting the directional coupler includes: adjusting an impedance value of an impedance arrangement connected to at least one coupling line port, adjusting a value of a coupling variance connected between a main line and a coupling line, or adjusting both the impedance value of the impedance arrangement and the value of the coupling variance until at least one of the conditions is met. In some instances, the impedance arrangement is driven by a control voltage. In some implementations, the steps of adjusting at least two impedances, wherein the impedances are alterable by at least one electronic control signal and are connected to at least one port, performing a calibration process by measuring signals at least one port of the directional coupler whilst the at least one electronic control signal for the impedances is controlled such that at least one of the conditions is met, and/or generating a frequency-dependent calibration curve are also included.

In another aspect, determining power consumed in a plasma load is accomplished using a directional coupler having a coupling factor in the forward direction determined from the equation $C_f = C_f \cdot e^{j\phi_{Cf}}$, a coupling factor in the reverse direction determined from the equation $C_r = C_r \cdot e^{j\phi_{Cr}}$, an isolation in the forward direction determined from the equation $I_f = I_f \cdot e^{j\phi_{If}}$, and an isolation in the reverse direction determined from the equation $I_r = I_r \cdot e^{j\phi_{Ir}}$, wherein at least one condition is met from among the group consisting of: (1) the absolute value of $\Delta\phi = \phi_{Cr} + \phi_{Cf} - (\phi_{Ir} + \phi_{If})$ being less than or equal to 20°, $$K = \frac{C_f}{C_r} * \frac{I_r}{I_f} \quad (2)$$

is less than or equal to 1.6, and (3) Cf=Cr and If=Ir.

In another aspect, the forward power delivered to a load from a HF generator and/or the reverse power reflected by the load can be measured more accurately using a directional coupler in which $|\Delta\phi| = |\phi_{Cr} + \phi_{Cf} - (\phi_{Ir} + \phi_{If})| \leq 20°$, preferably $\leq 10°$, especially preferably $\leq 5°$, and most preferably $\leq 1°$.

In a directional coupler designed in this manner, the measurement error when measuring the power delivered to the load and reflected from this, and hence the HF power absorbed in the load, is minimized. The above-mentioned criterion has not previously been taken into account in the manufacture of directional couplers. A directional coupler is mostly realized on printed circuit board material FR4 or to ceramics in the form of printed conductors. Nevertheless, during this actually quite accurate production method small inaccuracies do still occur, and consequently errors of such magnitude that a phase error $|\Delta\phi| \leq 20°$ can neither be purposely nor fortuitously attained. Only by using simulation aids and by means of state-of-the-art manufacturing technology is it possible to achieve values $|\Delta\phi| \leq 20°$. By means of subsequent work and specially developed manufacturing technology, is it possible to achieve values of less than 10°, less than 5° or even less than 1°. In the ideal case, $\Delta\phi = 0°$. This means $\phi_{Cr} + \phi_{Cf} = \phi_{Ir} + \phi_{If}$.

Alternatively or additionally, the directional coupler can be designed so that $$K = \frac{C_f}{C_r} * \frac{I_r}{I_f} \leq 1.6,$$

preferably $\leq 1.2$, especially preferably $\leq 1.1$. This means that, in the ideal case, $$\frac{C_f}{C_r}$$

corresponds approximately to $$\frac{I_f}{I_r}.$$

The error when measuring the power absorbed in the load is then dependent neither on the amount nor on the phase of the load reflection factor. As a result, the error during measurement is load-independent both according to the amount and according to the phase of the load. The error can therefore be excluded as a systematic error from the measured value and thus be fully compensated. A phase measurement between the incident wave (power delivered to the load) and the returning wave (power reflected from the load) is therefore superfluous. Costs for the components of the phase measurement can therefore be reduced. It should be borne in mind that according to the above-mentioned criterion it is not even necessary for the undesirable couplings ($I_f$, $I_r$) as a result of deficient attenuations to disappear, rather, their ratio must only be as large as that of $C_f$ and $C_r$.

It is especially preferred for the directional coupler to be reciprocal and for $C_f=C_r$ and $I_f=I_r$.

According to a refinement, the above-mentioned condition is achieved in an especially simple manner by a directional coupler in which $\phi_{Cr}=-\phi_{Cf}+k$ and $\phi_{Ir}=-\phi_{If}+k$, wherein k may assume any desired values. In the simplest case, k assumes the value 0, so that $\phi_{Cr}=-\phi_{Cf}$ and $\phi_{Ir}=-\phi_{If}$.

Further advantages arise if $I_f$ and/or $I_r > C_f$ and/or $C_r$. This means in particular that the values $I_f$ and/or $I_r$ should be as large as possible. Under these conditions, a very accurate value for the power that has remained (been absorbed) in the load can be determined.

The measurement of the power delivered to the load and obtained at port 2 of the auxiliary line is $P_{mi}=|b_2|^2$, and the measurement of the power reflected by the load and obtained at port 4 of the coupling line is $P_{mr}=|b_4|^2$. The measurement of the power that has remained in the load at the coupling lines of a non-optimized directional coupler, i.e. a directional coupler with error-prone measuring is $$\Delta P_{meas} = P_{mi} - P_{mr}$$

$$= |a_1|^2 \cdot \begin{bmatrix} \dfrac{1}{C_f^2} - \dfrac{\Gamma^2}{C_r^2} + \dfrac{\Gamma^2}{I_r^2} - \dfrac{1}{I_f^2} + \\ \dfrac{2\Gamma\cos(\varphi_{Ir} - \varphi_{Cf} - \varphi_\Gamma)}{C_f \cdot I_r} - \\ \dfrac{2\Gamma\cos(\varphi_{Cr} - \varphi_{If} - \varphi_\Gamma)}{I_f \cdot C_r} \end{bmatrix}$$

The actual power consumed in the load is obtained under the measuring condition $$\Delta P_{measopt} = |a_1|^2 \cdot \left[ \dfrac{1}{C_f^2} - \dfrac{\Gamma^2}{C_r^2} \right].$$

An optimum directional coupler measuring without error, and thus the power actually absorbed in the load, are obtained when the following conditions are taken into account:

1) $I_f$, $I_r$: as large as possible, and/or $$\dfrac{C_f}{C_r} = \dfrac{I_f}{I_r}, \qquad (2)$$

and/or $$\varphi_{Cr} + \varphi_{Cf} = \varphi_{Ir} + \varphi_{If} \qquad (3)$$

When these conditions are met, then $\Delta P_{meas}=\Delta P_{measopt}$; i.e. the load-dependent error during power measurement is minimized.

The directivity during operation (directivity in the strict definition with nominal impedance is not meant) is virtually independent of the load (dependent neither on the amount nor on the phase of the load reflection factor).

In another aspect, the directional coupler comprises two coupling lines, which at least in sections are arranged parallel to one another. They can consequently also be arranged parallel to a main line via which the power to be measured is transmitted. The power delivered in the direction of the load can be determined with the one coupling line and the power reflected by the load can be determined with the other coupling line. The coupling lines are preferably arranged on opposite sides of a main line.

The circuit connected to at least one port of the directional coupler can be designed so that it comprises a variable impedance arrangement, the impedance of which can be altered by electronic control signals. In the case of a directional coupler used for measuring purposes, the coupling line port not occupied by the measuring apparatus can be used for this.

By virtue of the in particular electronically variable impedance of the impedance arrangement, the decoupling factor and directivity of the directional coupler can be optimized. The impedance arrangement may comprise one or more elements, the impedance of the arrangement as a whole or of at least one element of the arrangement being alterable by the control signal. An impedance arrangement with variable impedance can be connected not only to a port but also anywhere to (at least) one coupling line.

If just the impedance of a single element or a group of elements is altered by the control signal, the overall impedance of the impedance arrangement is, of course, also altered.

The termination, i.e. the impedance arrangement, can consist of a real resistance and a variable capacitance diode. A control voltage as electrical control signal to the variable capacitance diode can alter the capacitance thereof.

The impedance arrangement can alternatively or additionally have an inductivity. An electronically controllable or adjustable inductivity and consequently a controllable impedance can be achieved, for example, through reducing the permeability of the coil core of the inductivity, by driving the magnetic flux towards the saturation limit of the core material by an additional magnetic field, which is generated with an auxiliary winding through which a direct current flows. A PIN diode, for example, can be used as an electronically variable, i.e. variable by an electronic control signal, real resistance.

In order to be able to set both real and imaginary resistance values for the impedance arrangement connected to a port, the impedance arrangement can comprise at least two controllable impedances, which are connected to the port and do not have a collinear effect on the complex resistance plane. This means that the phasors or vectors that describe the impedances in the resistance plane are not linearly dependent. Such an impedance arrangement can be, for example, a circuit comprising a variable capacitance diode and a PIN diode.

The electronically variable impedance can be adjusted as a function of the working frequency of the system in which the coupler is integrated, for example, the fundamental frequency of a HF power generator, as a function of the impedance of at least one source or drain connected to the coupler, and/or as a function of actual characteristic of the coupler manufactured.

In the case of more complex tasks, for example, compensation of impedances connected to two main line ports of a directional coupler that differ from the system impedance, both ports of the coupling line of this directional coupler, or correspondingly one port each or even both ports of two coupling lines can be connected to impedance arrangements with impedances controllable by an electronic signal.

When dimensioning the variation ranges of the controllable variable impedances, the characteristic of the directional coupler in the specified working frequency range and the range of the possible impedance variation of the connected sources and drains can be taken into account.

The control voltages for at least one electronically variable impedance can come from an electronic circuit which knows the current operating state of the apparatus, and hence the impedances connected to at least one port of the main line, the current working frequency and the frequency-dependent characteristic and/or the actual characteristic conditional on manufacture of the at least one coupler used.

The circuit can be of analog or digital construction, and also contain a microprocessor. The circuit can contain a memory or can have access to a memory which contains the parameters for certain impedance values at a port of the coupling line, the parameters for the compensation, for the frequency-dependent response or for the individual characteristic of the coupler or for other operating states of the high frequency system.

The memory can be a non-volatile memory, which is written during production and/or is integrated in the apparatus. Alternatively or additionally, the memory can be a writable memory, which is re-written, for example, during a calibration process.

The calibration process can be carried out by a regulating circuit, which measures the signals at least one port of the coupler whilst the control voltages for the electronically variable impedances are being regulated. In this way, the above-mentioned circuit can be used as a regulating circuit.

The electronic circuit can also operate as a continuous closed-loop control. In a first step, all parameters can be set or the closed-loop control can be operated so that an optimum response of the directional coupler commences, that is, for example, a very high directivity. The control loop should now have a low-pass characteristic, the limit frequency of which is lower than the anticipated change in the impedances of the connected sources and drains that are connected to the coupler. If the ratios of the impedances of the sources and drains now change, the closed-loop control will not be able to follow so quickly, so that the directional coupler arrangement, due to the high directivity, can reproduce the impedance changes very accurately. The coupling variances can be designed in accordance with the impedance arrangements. In particular, they can be in the form of fixed impedances, for example, impedances fixedly preset in the design, manually adjustable or electronically adjustable impedances. Furthermore, the use of PIN diodes, coils with adjustable saturation, variable capacitance diodes and the interconnection of a plurality of such elements are possible for the coupling variances.

A coupling variance can be arranged between at least one coupling line and the main line. In this case, the coupling variance may have a variable resistance. Alternatively or additionally, the position of the coupling variance between the coupling line and the main line is variable. A plurality of these additional coupling variances between the main and each coupling line can be used.

Further features and advantages of the invention will be apparent from the following description of exemplary embodiments of the invention, from the Figures of the drawings, which show details essential to the invention, and from the claims. The individual features can be embodied individually or jointly in any combination in a variant of the invention.

DESCRIPTION OF DRAWINGS

Preferred exemplary embodiments of the invention are illustrated schematically in the drawings and are explained in detail below with reference to the Figures of the drawings, in which.

Identical elements are denoted by the same reference numerals.

DETAILED DESCRIPTION

Figure 1A:
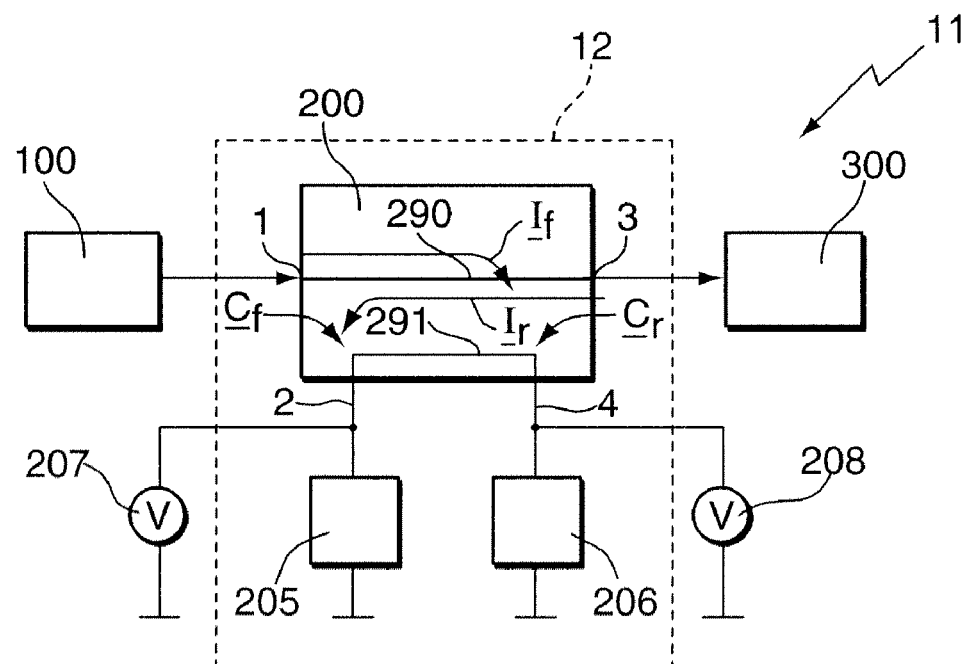
FIGS. 1a, 1b each show a high frequency system with directional coupler.
Figure 1B:
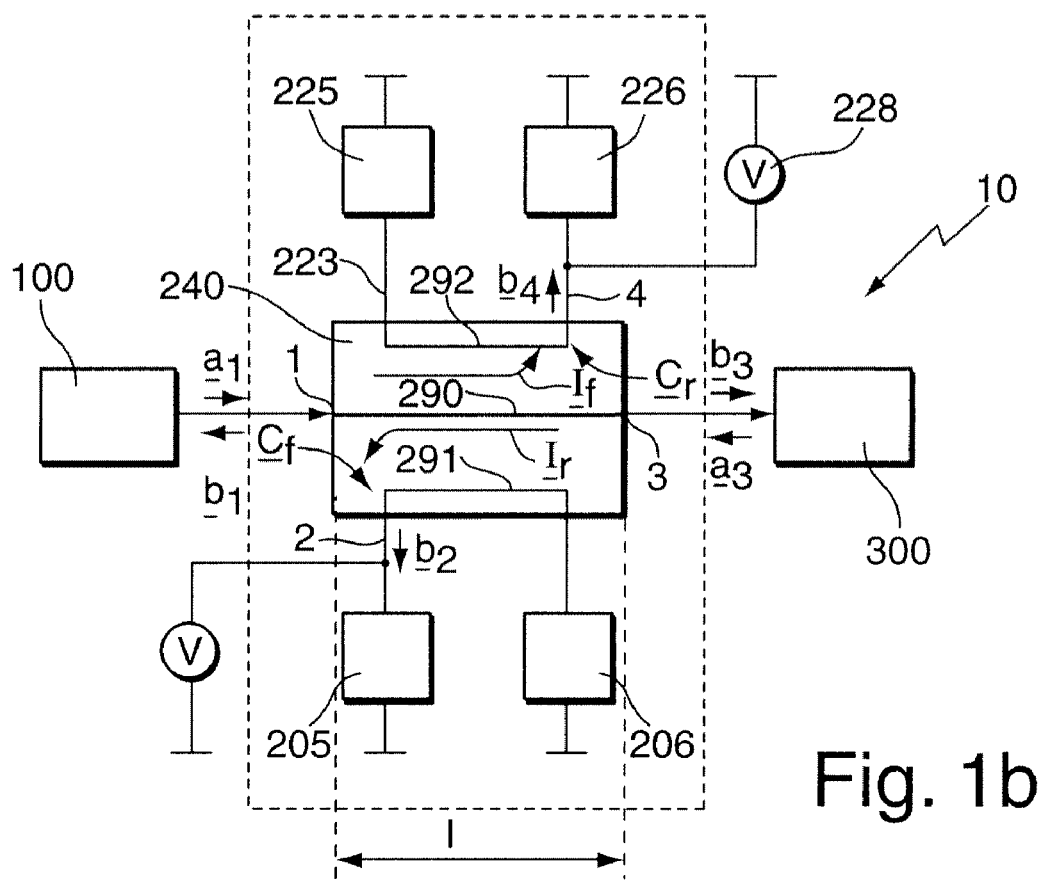
Figure 2:
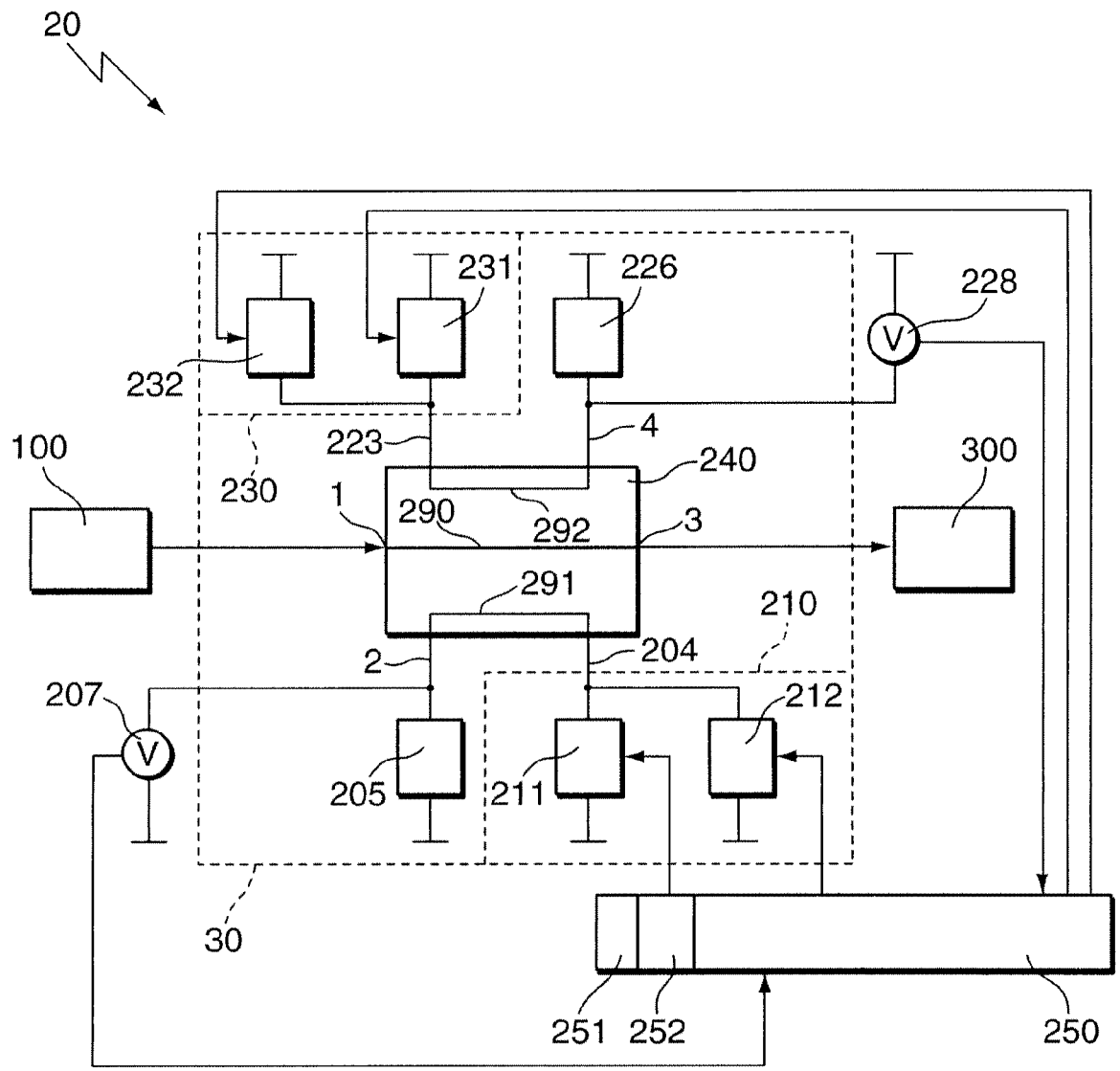
FIG. 2 shows a schematic representation of a high frequency system with a coupler arrangement and an impedance arrangement.

FIG. 2 shows a high frequency system 20 with a high frequency generator 100 as source, a coupler arrangement 30 with a coupler 240 in the form of a directional coupler, plus a load 300 as drain. The coupler 240 has a main line 290 with a first and second port 1, 3 (main line ports) and a coupling line 291 with coupling line ports 2, 204. Port 2 is terminated by a resistance 205, which corresponds to the nominal impedance $Z_0$ of the high frequency system 20 or at least to that of the coupler 240. A proportion of the incident wave at the corresponding port 1 of the main line 290 can be observed at port 2 using a measuring apparatus 207.

Furthermore, the coupler 240 has a second coupling line 292, with coupling line ports 223, 4. At port 4 of the second coupling line 292, a proportion of the wave fed in at port 3 of the main line 290 is measured. For that purpose a measuring apparatus 228 is connected to port 4. Port 4 of the second coupling line 292 is terminated by the resistance 226, which corresponds to the nominal impedance $Z_0$.

The measuring apparatuses 207, 208 shown in the Figures can each be voltmeters, oscilloscopes, diodes/demodulators or the like or analogue or digital evaluation circuits with or without previous rectification of the wave. Furthermore, the input impedances of the measuring apparatuses can replace the terminating impedances disposed at the same port or together with these can form the impedance present at the port.

In FIG. 2, the impedance arrangement 210 connected in accordance with the invention to the port 204 consists of two electronically controllable impedances 211, 212, which do not act collinearly with respect to one another in the complex resistance plane. By supplying a control voltage from the electronic circuit 250, these two impedances 211, 212 can be matched, whereby the port 204 is terminated with a specific, preset complex resistance. This means that the overall impedance of the impedance arrangement 210, which is made up of the impedances 211, 212, can be preset by the circuit 250.

Symmetrically with respect to port 204, port 223 is terminated with an impedance arrangement 230, comprising two impedances 231, 232, which are likewise driven by the electronic circuit 250.

The electronic circuit 250 receives further information, such as for example, the frequency-dependent response of the coupler 240, the instantaneous working frequency of the generator 100, the frequency-dependent complex internal resistance of the generator 100 and the frequency-dependent impedance of the load 300. The static variables, such as the frequency-dependent response of the coupler 240 or the frequency-dependent impedance of the generator 100 or of an antenna as load 300 can be stored in a memory. This can be effected in digital or analogue form. The memory can be permanent or rewritable. The memory can be contained in the circuit 250 or be arranged externally. In the exemplary embodiment shown, the memory 251 is arranged in the circuit 250.

In one embodiment of the invention, the coupler arrangement 30 or the coupler with associated impedance arrangements 210, 220 is calibrated. For that purpose, the measuring apparatuses 207, 228 are connected to the electronic circuit 250, which has a low-pass filter 252. At a frequency of the generator 100, or over a specific frequency range and under specific external conditions, for example, with a defined ohmic resistance or with an error-free antenna as load 300, the impedances 211, 212, 231, 232 are each driven so that the desired measured values are present at the ports 2 and 4. These control values are stored in the memory 251 and used during normal operation. If the working conditions now vary from the set point, then the measured values at the ports 2 and 4 will respond very sensitively thereto.

In an embodiment of the invention not shown, only one coupling line of the coupler 240 is equipped with the variable impedances, i.e. an impedance arrangement 210, 230 is connected only to one coupling line. However, an impedance arrangement 210, 230 can be connected to each of the two ports of the coupling line.

In one embodiment of the invention, a coupler 200 can be provided with only one coupling line 291. In that case, an impedance arrangement 210, 230 can be connected to each of the two ports of the coupling line 291. Alternatively, however, an impedance arrangement 210, 230 can be connected to just one port.

Figure 3:
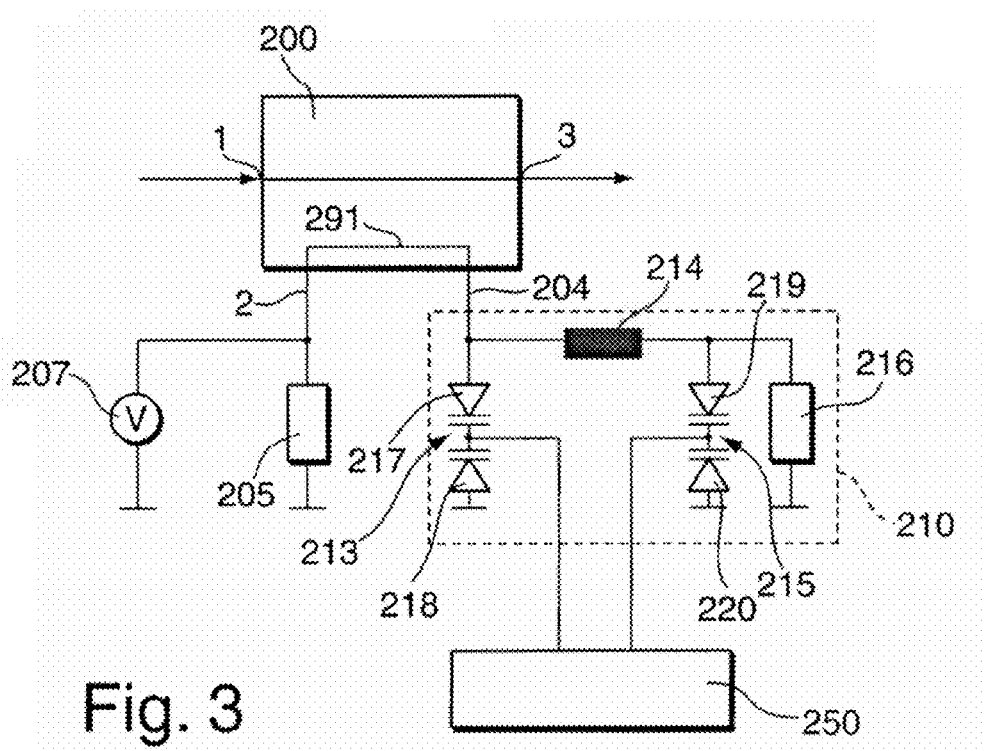
FIG. 3 shows an exemplary embodiment of an impedance arrangement.

FIG. 3 shows an embodiment for the impedance arrangement 210. Connected to ground at the port 204 of the coupling line 291 is a pair 213 of two anti-serially arranged variable capacitance diodes 217, 218, which represent a more or less large capacitance depending on the control voltage coming from the electronic circuit 250 that is applied to the midpoint or junction point of the pair 213. Via an inductivity 214, a further pair 215 of anti-serial variable capacitance diodes 219, 220 and a real resistance 216 are connected to the port 204, the second pole of which is connected to ground. By means of a control voltage at the midpoint of the diode pair 215, which likewise comes from the electronic circuit 250, the capacitance of this pair 215 can be influenced as well. The inductivity 214, the variable capacitance of the diode pair 215 and the real resistance 216 parallel to the capacitance together form an impedance, which is not collinear to the capacitance of the diode pair 213 in the complex resistance plane. From this it follows that the impedances of an impedance arrangement can each be built up from several components.

Figure 4:
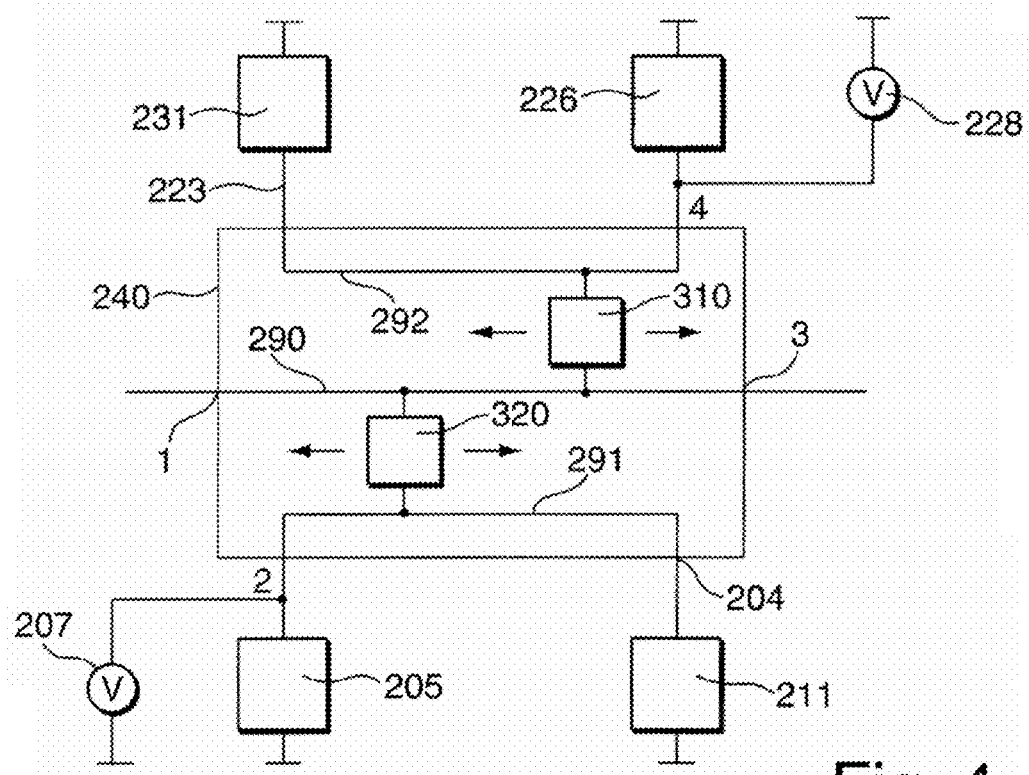
FIG. 4 shows a directional coupler with coupling variances.

In the exemplary embodiment of FIG. 4, the directional coupler 240 additionally comprises coupling variances 310, 320, in each case between the main line 290 and a coupling line 291. The coupling variances 310, 320 can be in the form of variable impedances. In particular, they can be of identical construction, like the impedance arrangement 210, 230 of FIG. 2, that is, e.g. can comprise a PIN diode as resistance, a coil with adjustable saturation, a variable capacitance diode or combinations thereof. In addition, provision can be made for the coupling variances 310, 320 to be displaceable in position along the main line 290 and the coupling lines 291, 292. The displacement can be effected during design or subsequently. The directional coupler 240 can thus be adjusted and designed in an even better manner.

What is claimed is:

1. A directional coupler having
a coupling factor in the forward direction determined from the equation $C_f = C_f \cdot e^{j\Phi_{Cf}}$,
a coupling factor in the reverse direction determined from the equation $C_r = C_r \cdot e^{j\Phi_{Cr}}$,
an isolation in the forward direction determined from the equation $I_f = I_f \cdot e^{j\Phi_{If}}$, and
an isolation in the reverse direction determined from the equation $I_r = I_r \cdot e^{j\Phi_{Ir}}$, the directional coupler comprising:
a main line;
a coupling line; and
a coupling variance connected to the main line and the coupling line;
wherein the coupling variance is adjustable to meet at least one condition from among the group consisting of:
(1) the absolute value of $\Delta\phi = \phi_{Cr} + \phi_{Cf} - (\phi_{Ir} + \phi_{If})$ being less than or equal to 20°, $$K = \frac{C_f}{C_r} * \frac{I_r}{I_f} \quad (2)$$

is less than or equal to 1.6, and
(3) Cf=Cr and If=Ir.

2. The directional coupler of claim wherein $\phi_{Cr} = -\phi_{Cf} + k$ and $\phi_{Ir} = -\phi_{If} + k$.

3. The directional coupler of claim 1, wherein $I_f$, $I_r$, or both, $I_f$ and $I_r$, are greater than $C_f$, $C_r$, or both $C_f$ and $C_r$.

4. The directional coupler of claim 1 further comprising two coupling lines, which at least in sections are arranged parallel to one another.

5. The directional coupler of claim 1 further comprising a coupling line terminated with an impedance arrangement having a variable impedance.

6. The directional coupler of claim 1, wherein the coupling variance has a variable resistance.

7. The directional coupler of claim 1, wherein the position of the coupling variance between the coupling line and the main line is alterable.

8. The directional coupler of claim 5, wherein an impedance value of the impedance arrangement can be altered by an electronic control signal.

9. The directional coupler of claim 5, wherein the impedance arrangement is driven by an electronic circuit.

10. The directional coupler of claim 9, wherein the electronic circuit is in the form of a closed loop circuit.

11. The directional coupler of claim 5, wherein the impedance arrangement comprises at least two variable impedances, which are not collinear in the complex resistance plane.

12. A method comprising adjusting a directional coupler having a coupling factor in the forward direction $C_f = C_f \cdot e^{j\Phi_{Cf}}$, a coupling factor in the reverse direction $C_r = C_r \cdot e^{j\Phi_{Cr}}$, an isolation in the forward direction $I_f = I_f \cdot e^{j\Phi_{If}}$, and an isolation in the reverse direction $I_r = I_r \cdot e^{j\Phi_{Ir}}$, wherein the directional coupler includes: a main line; a coupling line; and a coupling variance connected to the main line and the coupling line; and wherein responsive to the adjusting the coupling variance of the directional coupler, at least one condition is met from the group consisting of
$\Delta\phi = \phi_{Cr} + \phi_{Cf} - (\phi_{Ir} + \phi_{If})$ being less than or equal to 20°;
$K = C_f/C_r * I_r/I_f$ being less than or equal to 1.6; and
$I_f$, $I_r$, or, both, $I_f$ and $I_r$ are greater than $C_f$, $C_r$, or, both, $C_f$ and $C_r$.

13. The method of claim 12, wherein adjusting the directional coupler includes:
adjusting an impedance value of an impedance arrangement connected to at least one coupling line port,
adjusting a value of a coupling variance connected between a main line and a coupling line, or
adjusting both the impedance value of the impedance arrangement and the value of the coupling variance
until at least one of the conditions is met.

14. The method of claim 13, wherein the impedance arrangement is driven by a control voltage.

15. The method of claim 12, further comprising adjusting at least two impedances, wherein the impedances are alterable by at least one electronic control signal and are connected to at least one port.

16. The method of claim 15, further comprising performing a calibration process by measuring signals at least at one port of the directional coupler whilst the at least one electronic control signal for the impedances is controlled such that at least one of the conditions is met.

17. The method of claim 12, further comprising generating a frequency-dependent calibration curve.

18. A method of determining power consumed in a plasma load using a directional coupler comprising: a coupling factor in the forward direction determined from the equation $C_f = C_f \cdot e^{j\Phi_{Cf}}$; a coupling factor in the reverse direction determined from the equation $C_r = C_r \cdot e^{j\Phi_{Cr}}$; an isolation in the forward direction determined from the equation $I_f = I_f \cdot e^{j\Phi_{If}}$; an isolation in the reverse direction determined from the equation $I_r = I_r \cdot e^{j\Phi_{Ir}}$; a main line; a coupling line; and a coupling variance to the main line and the coupling line; wherein the coupling variance is adjustable to meet at least one condition from among the group consisting of:

(1) the absolute value of $\Delta\phi = \phi_{Cr} + \phi_{Cf} - (\phi_{Ir} + \phi_{If})$ being less than or equal to 20°, (2) $K = C_f/C_r * I_r/I_f$ is less than or equal to 1.6, and (3) Cf=Cr and If=Ir.

* * * * *

UNITED STATES PATENT AND TRADEMARK OFFICE
CERTIFICATE OF CORRECTION

| | | |
|---|---|---|
| PATENT NO. | : 8,203,398 B2 | |
| APPLICATION NO. | : 12/537557 | |
| DATED | : June 19, 2012 | |
| INVENTOR(S) | : Ekkehard Mann et al. | |

It is certified that error appears in the above-identified patent and that said Letters Patent is hereby corrected as shown below:

Column 10, line 12 (Claim 2) delete "claim" and insert --claim 1--.

Column 10, line 47 (Claim 12) delete "from" and insert --from among--.

Column 10, line 48 (Claim 12) delete "of" and insert --of:--.

Column 10, line 51 (Claim 12) delete "or, both" and insert --or both,--.

Column 10, line 51 (Claim 12) delete "or, both" and insert --or both,--.

Signed and Sealed this
Thirtieth Day of October, 2012

David J. Kappos
*Director of the United States Patent and Trademark Office*